(12) United States Patent
Kim

(10) Patent No.: US 11,929,740 B2
(45) Date of Patent: Mar. 12, 2024

(54) RELAY CONTROL APPARATUS

(71) Applicant: LG ENERGY SOLUTION, LTD., Seoul (KR)

(72) Inventor: Hak-Soon Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 267 days.

(21) Appl. No.: 17/608,669

(22) PCT Filed: Dec. 30, 2020

(86) PCT No.: PCT/KR2020/019449
§ 371 (c)(1),
(2) Date: Nov. 3, 2021

(87) PCT Pub. No.: WO2021/137640
PCT Pub. Date: Jul. 8, 2021

(65) Prior Publication Data
US 2022/0231679 A1 Jul. 21, 2022

(30) Foreign Application Priority Data
Jan. 3, 2020 (KR) .................. 10-2020-0000993

(51) Int. Cl.
*H02H 3/00* (2006.01)
*H02J 7/00* (2006.01)
*H03K 17/082* (2006.01)

(52) U.S. Cl.
CPC ........ *H03K 17/082* (2013.01); *H02J 7/00308* (2020.01); *H02J 7/0031* (2013.01); *H02J 7/0047* (2013.01); *H02J 7/0063* (2013.01)

(58) Field of Classification Search
None
See application file for complete search history.

(56) References Cited

U.S. PATENT DOCUMENTS 5,130,916 A * 7/1992 Toth .................. F21V 21/22
362/802
6,636,020 B1 10/2003 Ronald
(Continued)

FOREIGN PATENT DOCUMENTS

EP 3 145 043 A1 3/2017
JP 7-120534 12/1995
(Continued)

OTHER PUBLICATIONS

International Search Report for PCT/KR2020/019449 dated Apr. 26, 2021.
(Continued)

*Primary Examiner* — Stephen W Jackson
(74) *Attorney, Agent, or Firm* — Birch, Stewart, Kolasch & Birch, LLP

(57) ABSTRACT

A relay control apparatus according to an embodiment of the present disclosure includes: a relay disposed on a main path between a battery cell and a pack terminal and for electrically connecting or disconnecting the main path according to an operation state of the relay; and a comparator for receiving a comparison voltage from the main path and outputting a result signal to the relay based on a difference between a reference voltage and the comparison voltage, the relay is receives the result signal and controls the operation state of the relay to a turn-on state or a turn-off state according to the magnitude of the received result signal.

9 Claims, 3 Drawing Sheets

(56) References Cited

U.S. PATENT DOCUMENTS

| | | | |
|---|---|---|---|
| 6,798,175 | B2 | 9/2004 | Hanada et al. |
| 2005/0017698 | A1 | 1/2005 | De Boer |
| 2013/0200847 | A1 | 8/2013 | Kurokawa et al. |
| 2013/0229186 | A1* | 9/2013 | Shiraishi ............ G01R 31/3277 |
| | | | 324/415 |
| 2016/0241051 | A1* | 8/2016 | Yang .................... H01M 10/46 |
| 2018/0048166 | A1 | 2/2018 | Hsu et al. |

FOREIGN PATENT DOCUMENTS

| | | |
|---|---|---|
| JP | 2005-512485 A | 4/2005 |
| JP | 2007-124775 A | 5/2007 |
| JP | 2009-106039 A | 5/2009 |
| JP | 2012-42419 A | 3/2012 |
| JP | 5793121 B2 | 10/2015 |
| JP | 5910172 B2 | 4/2016 |
| JP | 2016-208707 A | 12/2016 |
| KR | 10-2007-0005272 A | 1/2007 |
| KR | 10-2016-0100675 A | 8/2016 |
| KR | 10-2019-0119407 A | 10/2019 |
| KR | 10-2019-0139615 A | 12/2019 |
| KR | 10-2063937 B1 | 1/2020 |
| WO | WO 96/13890 A1 | 5/1996 |

OTHER PUBLICATIONS

Extended European Search Report for Application No. 20911184.8 dated Oct. 11, 2022.

* cited by examiner

RELAY CONTROL APPARATUS

TECHNICAL FIELD

The present application claims priority to Korean Patent Application No. 10-2020-0000993 filed on Jan. 3, 2020 in the Republic of Korea, the disclosures of which are incorporated herein by reference.

The present disclosure relates to a relay control apparatus, and more particularly, to a relay control apparatus for preventing a surge from flowing into a relay.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

In the process of charging and discharging such a battery, if an overvoltage is applied, not only the battery but also elements of a battery pack including the battery may be seriously damaged.

Conventionally, in order to prevent the battery and the load from being damaged due to such high voltage, a battery pack that determines whether a high voltage is applied to the battery pack and controls the operation state of a charging switch or a discharging switch according to the determined result, and its driving method have been disclosed (Patent Document 1).

However, in Patent Document 1, since the operation state of the charging switch and the discharging switch is controlled through a BMS, when the BMS is in a wake-up state, it is impossible to control the operation state of the charging switch and the discharging switch even if an overvoltage is applied to the battery pack.

In addition, Patent Document 1 discloses a configuration for setting the voltage of a reference power source compared to the voltage of a positive electrode terminal based on a maximum voltage that can be charged to the capacitor. Here, if the voltage of the reference power source is greater than a withstanding voltage of the charging switch and the discharging switch, there is a problem that the charging switch and the discharging switch may be damaged when the operation states of the charging switch and the discharging switch are turned on. That is, in Patent Document 1, the voltage of the reference power source is just set based on the maximum voltage of the capacitor in order to prevent high current from flowing according to the voltage of the capacitor, and it does not disclose that the reference voltage is set in consideration of the withstanding voltage of the charging switch and the discharging switch at all.

Accordingly, Patent Document 1 has a problem that damage may be caused by applying a voltage higher than the withstanding voltage to the charging switch and the discharging switch, even if it is not overcurrent, based on the maximum voltage of the capacitor.

(Patent Document 1) KR 10-2016-0100675 A

DISCLOSURE

Technical Problem

The present disclosure is designed to solve the problems of the related art, and therefore the present disclosure is directed to providing a relay control apparatus capable of controlling the operation state of a relay according to a reference voltage set to correspond to the withstanding voltage of the relay.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a relay control apparatus, comprising: a relay disposed on a main path between a battery cell and a pack terminal and configured to electrically connect or disconnect the main path according to an operation state of the relay; and a comparator configured to receive a comparison voltage from the main path and output a result signal to the relay based on a difference between a reference voltage and the comparison voltage.

The relay may be further configured to receive the result signal and control the operation state of the relay to a turn-on state or a turn-off state according to a magnitude of the received result signal.

The comparator may be configured to receive the comparison voltage between the relay and the pack terminal.

The relay may include a diode disposed so that a direction from the battery cell toward the pack terminal is a forward direction.

The comparator may be configured to receive a reference voltage corresponding to a withstanding voltage of the relay.

The comparator may be configured to output a first result signal for controlling the operation state of the relay to a turn-off state, when the comparison voltage is greater than the reference voltage.

The comparator may be configured to output a second result signal for controlling the operation state of the relay to a turn-on state, when the comparison voltage is smaller than the reference voltage.

In another aspect of the present disclosure, the relay control apparatus may further comprise: a voltage source configured to apply the reference voltage to the comparator; a variable resistor configured to be disposed between the voltage source and the comparator; and a controller configured to adjust a magnitude of the reference voltage applied to the comparator to correspond to the withstanding voltage of the relay by adjusting a resistance of the variable resistor.

The controller may be configured to determine a degree of degradation of the relay and adjust a magnitude of the variable resistor based on the determined degree of degradation.

The controller may be configured to determine the degree of degradation according to a number of operations of the relay.

The control unit may be configured to determine the degree of degradation according to the number of operations of the relay.

In still another aspect of the present disclosure, there is provided a battery pack, comprising the relay control apparatus according to the present disclosure.

Advantageous Effects

According to one aspect of the present disclosure, it is possible to prevent a surge from flowing into the relay. Therefore, it is possible to prevent the relay from being damaged due to an inflow surge.

Also, according to an aspect of the present disclosure, a reference voltage may be set to correspond to the withstanding voltage of the relay. Therefore, even if the relay is degraded, it may be possible to prevent a surge from flowing into the relay, based on the reference voltage corresponding to the withstanding voltage of the relay. In addition, even if the withstanding voltage is changed due to the replacement of the relay, a reference voltage corresponding to the changed withstanding voltage may be set.

In addition, according to an aspect of the present disclosure, since a surge is prevented from flowing into the relay, elements provided in a battery pack including the relay control apparatus may be prevented from being damaged by the surge.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
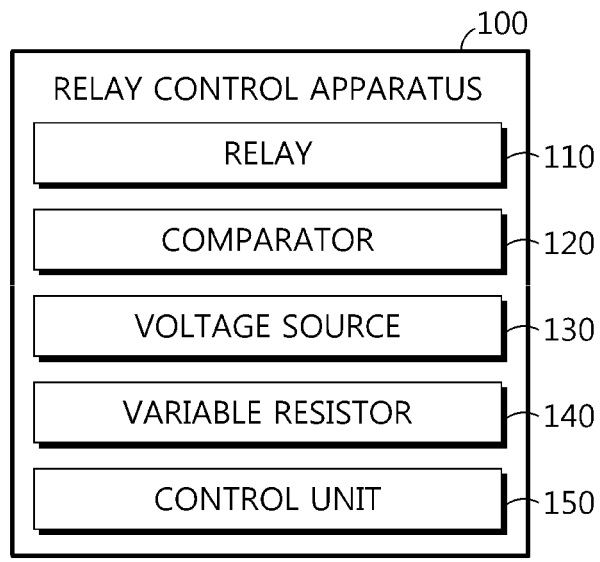
FIG. 1 is a diagram schematically showing a relay control apparatus according to an embodiment of the present disclosure.
Figure 2:
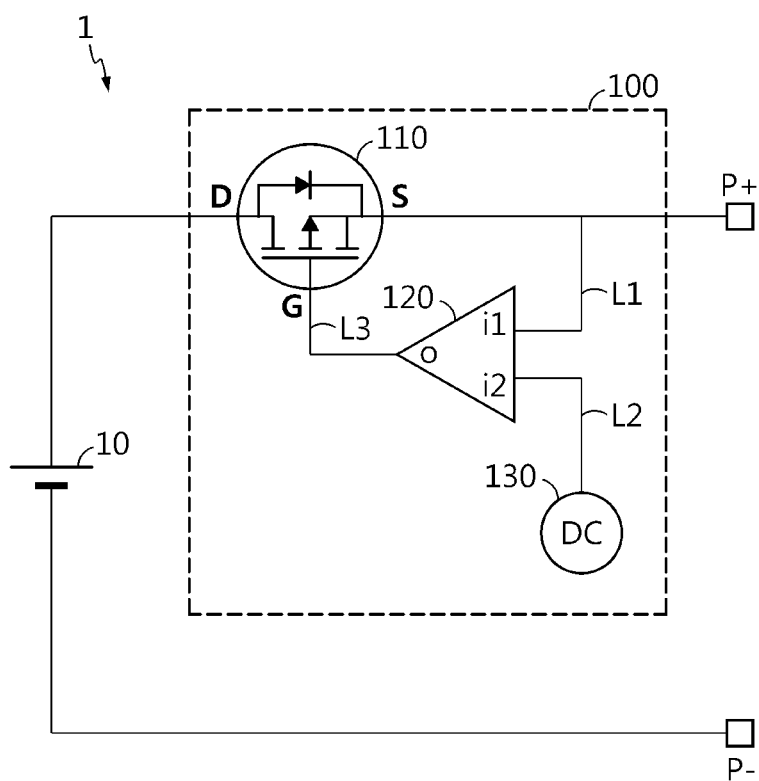
FIG. 2 is a diagram showing an exemplary configuration of a battery pack including the relay control apparatus according to an embodiment of the present disclosure.

FIG. 1 is a diagram schematically showing a relay control apparatus 100 according to an embodiment of the present disclosure. FIG. 2 is a diagram showing an exemplary configuration of a battery pack 1 including the relay control apparatus 100 according to an embodiment of the present disclosure.

Referring to FIG. 2, the relay control apparatus 100 according to an embodiment of the present disclosure may be provided to a battery pack 1.

For example, in the embodiment of FIG. 2, the battery pack 1 may include a battery cell 10 and a relay control apparatus 100.

Here, the battery cell 10 means one independent cell that has a negative electrode terminal and a positive electrode terminal and is physically separable. For example, one lithium ion battery or one lithium polymer battery may be regarded as the battery cell 10. In addition, unlike the embodiment of FIG. 2, the battery pack 1 may include at least one battery module in which one or more battery cells 10 are connected in series and/or in parallel. Hereinafter, for convenience of description, it will be described that one battery cell 10 is provided in the battery pack 1.

Referring to FIGS. 1 and 2, the relay control apparatus 100 according to an embodiment of the present disclosure may include a relay 110 and a comparator 120.

The relay 110 is disposed on a main path between a battery cell 10 and a pack terminal and may be configured to electrically connect or disconnect the main path according to an operation state.

Here, the main path may be a path between the battery cell 10 and an electrode terminal of the battery pack 1. That is, the main path may be a high current path through which a charging current or a discharging current of the battery cell 10 flows.

For example, in the embodiment of FIG. 2, the relay 110 may be disposed between the battery cell 10 and a positive electrode terminal P+ of the battery pack 1.

The comparator 120 may be configured to receive a comparison voltage from the main path.

Specifically, the comparator 120 may include a first input terminal i1 for receiving a comparison voltage, a second input terminal i2 for receiving a reference voltage, and an output terminal o for outputting a result signal. In addition, the comparator 120 may further include a power terminal to which a driving power is applied, and preferably, the driving power may be applied from the battery cell 10.

For example, in the embodiment of FIG. 2, the first input terminal i1 of the comparator 120 may be connected to the main path through a first line L1. The voltage applied to the main path may be input to the first input terminal i1 of the comparator 120 through the first line L1.

In addition, in the embodiment of FIG. 2, the second input terminal i2 of the comparator 120 may be connected to a second line L2. Therefore, the reference voltage may be input to the second input terminal i2 of the comparator 120 through the second line L2.

In addition, in the embodiment of FIG. 2, the output terminal o of the comparator 120 may be connected to a third line L3. Specifically, the output terminal o of the comparator 120 may be connected to the relay 110 through the third line L3. Therefore, the result signal output from the comparator 120 may be input to the relay 110 through the third line L3.

In addition, the comparator 120 may be configured to output a result signal to the relay 110 based on a difference between the reference voltage and the comparison voltage.

Preferably, the comparator 120 may output different result signals according to the magnitudes of the reference voltage and the comparison voltage. For example, if the reference voltage is greater than the comparison voltage, the comparator 120 may output a first result signal, and if the reference voltage is smaller than the comparison voltage, the comparator 120 may output a second result signal.

In the embodiment of FIG. 2, the output terminal o of the comparator 120 may output the first result signal or the second result signal according to the magnitudes of the reference voltage and the comparison voltage.

The relay 110 may be configured to receive the result signal.

Preferably, the relay 110 may be a field effect transistor (FET). More preferably, the relay 110 may be a metal-oxide semiconductor field effect transistor (MOSFET).

For example, in the embodiment of FIG. 2, the relay 110 may include a gate terminal G, a drain terminal D, and a source terminal S. Preferably, the drain terminal D of the relay 110 may be connected to a positive electrode terminal of the battery cell 10, and the source terminal S may be connected to the positive electrode terminal P+ of the battery pack 1. In addition, the gate terminal G can be connected to the output terminal o of the comparator 120. Therefore, the result signal output from the comparator 120 may be applied to the gate terminal G of the relay 110.

The relay 110 may be configured to control its operation state to a turn-on state or a turn-off state according to the magnitude of the received result signal.

The operation state may be controlled to correspond to the result signal received from the comparator 120. For example, the relay 110 may be a P-channel MOSFET. Due to the characteristics of the P-channel MOSFET, the relay 110 may be controlled to a turn-off state if a voltage greater than a threshold voltage is applied to the gate terminal G, and the relay 110 may be controlled to a turn-on state if a voltage smaller than the threshold voltage is applied.

More specifically, an embodiment in which the operation state of the relay 110 is controlled will be described with reference to FIG. 3.

Figure 3:
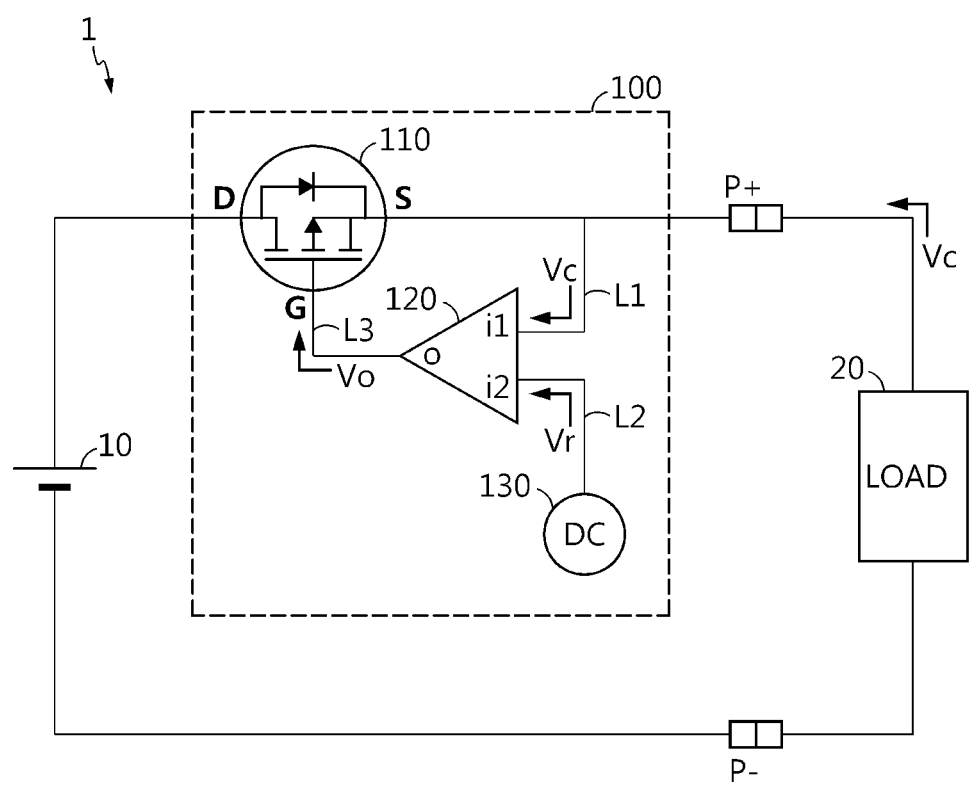
FIG. 3 is a diagram showing another exemplary configuration of the battery pack including the relay control apparatus according to an embodiment of the present disclosure.

FIG. 3 is a diagram showing another exemplary configuration of the battery pack 1 including the relay control apparatus 100 according to an embodiment of the present disclosure. Specifically, FIG. 3 is a diagram showing an example in which a load 20 is connected to the battery pack 1 in the embodiment of FIG. 2.

Referring to FIG. 3, a comparison voltage (Vc) may be applied from the load 20 through the first line L1 to the first input terminal i1 of the comparator 120, and the reference voltage (Vr) may be applied to the second input terminal i2 through the second line L2. In addition, the output terminal o of the comparator 120 may be connected to the gate terminal G of the relay 110 through the third line L3, so that the result signal (Vo) is applied to the gate terminal G.

If the comparison voltage (Vc) is greater than the reference voltage (Vr), the comparator 120 may output the first result signal for controlling the operation state of the relay 110 to a turn-off state.

For example, in the embodiment of FIG. 3, if the comparison voltage (Vc) input to the first input terminal i1 through the first line L1 is greater than the reference voltage (Vr) input to the second input terminal i2 through the second line L2, the first result signal may be output from the output terminal o as the result signal (Vo). The first result signal may be applied to the gate terminal G through the third line L3. In this case, the voltage difference between the gate terminal G and the source terminal S may be greater than the threshold voltage. Therefore, the relay 110 comes to a turn-off state, and a current may not flow from the source terminal S toward the drain terminal D.

Conversely, if the comparison voltage (Vc) is smaller than the reference voltage (Vr), the comparator 120 may be configured to output the second result signal for controlling the operation state of the relay 110 to a turn-on state.

For example, in the embodiment of FIG. 3, if the comparison voltage (Vc) input to the first input terminal i1 through the first line L1 is smaller than the reference voltage (Vr) input to the second input terminal i2 through the second line L2, the second result signal may be output from the output terminal o as the result signal (Vo). The second result signal may be applied to the gate terminal G through the third line L3. In this case, the voltage difference between the gate terminal G and the source terminal S may be lower than the threshold voltage. Therefore, the relay 110 comes to a turn-on state, and a channel may be formed between the source terminal S and the drain terminal D. A current may flow from the source terminal S toward the drain terminal D through this channel.

Therefore, the relay control apparatus 100 according to an embodiment of the present disclosure may block a surge that flows from the load 20 toward the battery cell 10. Therefore, it is possible to prevent the relay 110 from being damaged due to the relay control apparatus 100. In addition, since a surge is emitted through the ground connected to the comparator 120, it is possible to prevent internal elements of the battery pack 1 including the relay control apparatus 100 from being damaged due to the surge.

Meanwhile, the control unit 150 provided to the relay control apparatus 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 150 may be implemented as a set of program modules. At this time, the program module may be stored in a memory and executed by the control unit 150. The memory may be located inside or out of the control unit 150 and may be connected to the control unit 150 by various well-known means.

The comparator 120 may be configured to receive the comparison voltage between the relay 110 and the pack terminal.

Specifically, the comparator 120 may be connected between the relay 110 and the positive electrode terminal P+ of the battery pack 1. In addition, the comparator 120 may receive a voltage between the relay 110 and the positive electrode terminal P+ of the battery pack 1 as the comparison voltage.

For example, in the embodiment of FIG. 3, the comparator 120 may be connected between the source terminal S of the relay 110 and the positive electrode terminal P+ of the battery pack 1 through the first line L1. In addition, the comparator 120 may receive a voltage between the source terminal S of the relay 110 and the positive electrode terminal P+ of the battery pack 1 as the comparison voltage (Vc) through the first input terminal i1. Here, the comparison voltage (Vc) may be the same as the voltage of the load 20.

In addition, if the comparison voltage (Vc) is lower than the reference voltage (Vr), the comparator 120 may control the operation state of the relay 110 to a turn-on state. In other words, the comparator 120 may prevent that a high current flows as a high voltage is applied to the relay 110.

Therefore, the relay control apparatus 100 according to an embodiment of the present disclosure may prevent a high current from flowing through the relay 110, thereby preventing the relay 110 from being damaged by the high current. In addition, the relay control apparatus 100 may prevent internal elements of the battery pack 1 from being damaged due to a high current passing through the relay 110.

The relay 110 may include a diode disposed so that a direction from the battery cell 10 toward the pack terminal is a forward direction.

Specifically, the relay 110 may include a diode in which a direction from the drain terminal D toward the source terminal S is a forward direction. Here, the diode may be a parasitic diode (a body diode).

For example, in the embodiment of FIG. 2, it is assumed that the load 20 is connected to the battery pack 1. In a discharging situation of the battery cell 10, the current output from the battery cell 10 may pass through the relay 110 through the diode. In addition, since a voltage is applied between the source terminal S of the relay 110 and the positive electrode terminal P+ of the battery pack 1 by the current passing through the diode, a comparison voltage may be applied to the first input terminal i1 of the comparator 120. If the magnitude of the comparison voltage is smaller than the reference voltage, the operation state of the relay 110 may be controlled to a turn-on state by the result signal output from the comparator 120. At this time, since a channel is formed between the drain terminal D and the source terminal S of the relay 110, the current output from the battery cell 10 may flow through the formed channel. Therefore, in the discharging process of the battery cell 10, the discharging current initially flows through the diode, but may flow through the channel formed in the relay 110 afterwards.

As another example, in the embodiment of FIG. 3, it is assumed that the load 20 is connected to the battery pack 1 and a charging current flows from the load 20. In this case, unlike the discharging situation, the charging current flowing from the load 20 may not pass through the diode provided in the relay 110. That is, the charging current may pass through the relay 110 only when the operation state of the relay 110 is controlled to a turn-on state. Therefore, it is possible to prevent the relay 110 from being damaged due to the inflow of a surge.

The comparator 120 may be configured to receive a reference voltage corresponding to a withstanding voltage of the relay 110.

Here, the withstanding voltage may mean an internal voltage that the relay 110 may withstand without damage. That is, by setting the reference voltage of the comparator 120 to correspond to the withstanding voltage of the relay 110, it is possible to prevent a voltage higher than the withstanding voltage from being applied to the relay 110.

For example, in the embodiment of FIG. 3, if the comparison voltage (Vc) applied from the load 20 is greater than the reference voltage (Vr) set to correspond to the withstanding voltage of the relay 110, the first result signal may be output as the result signal (Vo) from the comparator 120. In addition, the operation state of the relay 110 may be controlled to a turn-off state. Therefore, the connection between the battery cell 10 and the load 20 may be blocked.

If the comparison voltage (Vc) applied from the load 20 is smaller than the reference voltage (Vr) set to correspond to the withstanding voltage of the relay 110, the second result signal may be output as the result signal (Vo) from the comparator 120. In addition, the operation state of the relay 110 may be controlled to a turn-on state. Therefore, since the battery cell 10 and the load 20 may be electrically connected, the battery cell 10 may be charged by the load 20.

The relay control apparatus 100 according to an embodiment of the present disclosure may prevent a high voltage over the withstanding voltage from being applied to the relay 110 by setting the reference voltage to correspond to the withstanding voltage of the relay 110. Therefore, it is possible to prevent the relay 110 from being damaged, thereby increasing the life of the relay 110.

Figure 4:
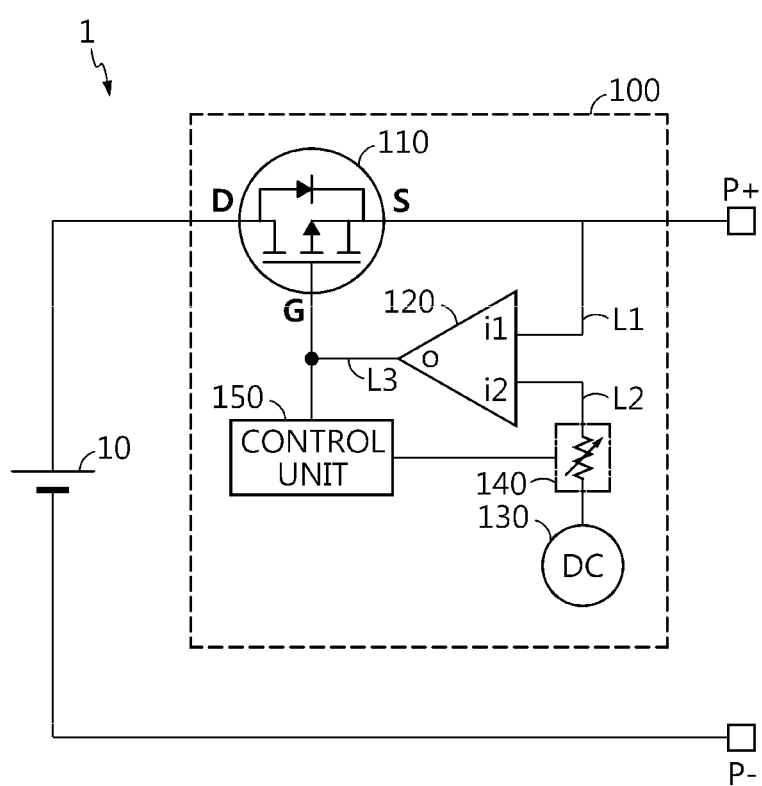
FIG. 4 is a diagram showing an exemplary configuration of a battery pack including a relay control apparatus according to another embodiment of the present disclosure.

FIG. 4 is a diagram showing an exemplary configuration of a battery pack 1 including a relay control apparatus 100 according to another embodiment of the present disclosure.

Referring to FIGS. 1 and 4, the relay control apparatus 100 according to another embodiment of the present disclosure may further include a voltage source 130, a variable resistor 140, and a control unit 150.

The voltage source 130 may be configured to apply the reference voltage to the comparator 120.

Here, the voltage source 130 may be a voltage source for applying the reference voltage to the comparator separately from the battery cell 10. Preferably, the voltage source 130 may apply a DC voltage to the comparator 120.

For example, in the embodiment of FIG. 4, the voltage source 130 may be connected to the second input terminal i2 of the comparator 120 through the second line L2. The voltage output from the voltage source 130 may be applied to the second input terminal i2 of the comparator 120 through the second line L2.

The variable resistor 140 may be configured to be disposed between the voltage source 130 and the comparator 120.

The variable resistor 140 may be a device whose resistance may be changed according to settings. That is, the DC voltage output from the voltage source 130 may pass through the variable resistor 140, and at this time a voltage drop may occur. Therefore, the variable resistor 140 may be configured so that the dropped voltage corresponds to the withstanding voltage of the relay 110.

For example, in the embodiment of FIG. 4, the variable resistor 140 may be disposed on the second line L2. That is, one end of the variable resistor 140 may be connected to the voltage source 130 through the second line L2, and the other end of the variable resistor 140 may be connected to the second input terminal i2 of the comparator 120 through the second line L2.

The control unit 150 may be configured to adjust the resistance of the variable resistor 140.

Preferably, the variable resistor 140 may be an electronic variable resistor 140. Therefore, the resistance of the variable resistor 140 may be adjusted by the control unit 150.

For example, in the embodiment of FIG. 4, the control unit 150 may be electrically connected to the variable resistor 140. In addition, the control unit 150 may adjust the resistance of the variable resistor 140 by outputting a control signal to the variable resistor 140.

In addition, the control unit 150 may be configured to adjust the magnitude of the reference voltage applied to the comparator 120 so as to correspond to the withstanding voltage of the relay 110.

Preferably, the control unit 150 may obtain the voltage information output from the voltage source 130 in advance. For example, the output voltage information according to the specifications of the voltage source 130 may be stored in advance in an internal memory of the control unit 150.

In addition, the control unit 150 may obtain withstanding voltage information of the relay 110 in advance. For example, the withstanding voltage information of the relay 110 may be stored in advance in the internal memory of the control unit 150. Here, the withstanding voltage information of the relay 110 may be initial withstanding voltage information of the relay 110.

The control unit 150 may adjust the resistance of the variable resistor 140 based on the withstanding voltage information of the relay 110 and the output voltage information of the voltage source 130 obtained in advance, so that the reference voltage applied to the second input terminal i2 of the comparator 120 is adjusted to correspond to the withstanding voltage of the relay 110.

Preferably, the control unit 150 may adjust the magnitude of the reference voltage applied to the second input terminal i2 of the comparator 120 so as to be the same as the withstanding voltage of the relay 110.

Therefore, the relay control apparatus 100 according to an embodiment of the present disclosure may prevent the relay 110 from being damaged due to a high voltage applied thereto by adjusting the magnitude of the reference voltage to correspond to the withstanding voltage of the relay 110.

That is, even if the relay 110 is replaced, the relay control apparatus 100 may change the resistance of the variable resistor 140 based on the withstanding voltage information of the replaced relay 110 and the output voltage information of the voltage source 130. Therefore, since the relay control apparatus 100 may adjust the reference voltage according to the withstanding voltage information of the relay 110, the present disclosure may be applied universally without being limited to any specifications or types of the relay 110.

The control unit 150 may be configured to determine the degree of degradation of the relay 110.

In addition, the relay 110 may be degraded in proportion to the number of operations. For example, whenever the relay 110 is controlled to a turn-on state to allow a current to pass therethrough, the relay 110 may be gradually degraded. Accordingly, the control unit 150 may determine the degree of degradation of the relay 110 based on the number of operations of the relay 110, namely the number of times that the relay 110 is shifted to a turn-on state.

For example, in the embodiment of FIG. 4, the control unit 150 may be connected to the output terminal o of the comparator 120. In addition, the control unit 150 may receive the result signal output from the comparator 120. That is, the result signal output from the comparator 120 may be applied to the control unit 150 and the gate terminal G of the relay 110. The control unit 150 may obtain and store the threshold voltage of the relay 110 in advance. Accordingly, the control unit 150 may calculate the number of operations of the relay 110 by comparing the threshold voltage of the relay 110 with the magnitude of the result signal received from the comparator 120. In addition, the control unit 150 may determine the degree of degradation of the relay 110 based on the calculated number of operations of the relay 110.

That is, as described above, the operation state of the relay 110 may be controlled to a turn-on state by the result signal output from the comparator 120 in a discharging situation by the battery cell 10. In addition, even in a charging situation by the load 20, the operation state of the relay 110 may be controlled to a turn-on state by the result signal output from the comparator 120. Considering both of these situations, the control unit 150 may determine the degree of degradation of the relay 110 by calculating the number of operations of the relay 110.

In addition, as another example, as the relay 110 is degraded, the internal resistance of the relay 110 may increase. Therefore, the control unit 150 may determine the degree of degradation of the relay 110 by calculating the voltage dropped by the relay 110. Although not shown in the embodiment of FIG. 4, the control unit 150 may be electrically connected to both ends of the relay 110. In addition, the control unit 150 may determine the degree of degradation of the relay 110 by calculating the voltage dropped by the relay 110.

The control unit 150 may be configured to adjust the magnitude of the variable resistor 140 based on the determined degree of degradation.

The withstanding voltage of the relay 110 may be reduced to correspond to the degree of degradation of the relay 110. If the reference voltage applied to the comparator 120 is set without reflecting the withstanding voltage reduced by the degradation of the relay 110, the reference voltage may be greater than the withstanding voltage of the relay 110. In this case, a voltage greater than the withstanding voltage of the relay 110 may be applied to the relay 110.

For example, in the embodiment of FIG. 4, it is assumed that the withstanding voltage of the relay 110 is lower than the reference voltage applied to the second input terminal i2 of the comparator 120 since the relay 110 is degraded. Since the comparator 120 outputs a result signal according to the result of comparing the reference voltage applied to the second input terminal i2 with the comparison voltage applied to the first input terminal i1, a comparison voltage greater than the withstanding voltage of the relay 110 may be applied to the relay 110. Therefore, there is a problem in that a high voltage greater than the withstanding voltage is applied to the relay 110 to damage the relay 110, which may destroy the insulation of the relay 110, or in severe cases, burn the relay 110.

Therefore, the control unit 150 may adjust the magnitude of the reference voltage applied to the comparator 120 to correspond to the withstanding voltage of the relay 110 by adjusting the resistance of the variable resistor 140 to correspond to the degree of degradation of the relay 110.

The relay control apparatus 100 according to an embodiment of the present disclosure may more effectively prevent the relay 110 from being damaged due to a high voltage applied thereto by setting the reference voltage in consideration of the degree of degradation of the relay 110. In addition, the relay control apparatus 100 has an advantage of providing information on the replacement timing of the relay 110 since it determines the degree of degradation of the relay 110.

The relay control apparatus 100 according to the present disclosure may be applied to a BMS (Battery Management System). That is, the BMS according to the present disclosure may include the relay control apparatus 100 described above. In this configuration, at least some of components of the relay control apparatus 100 may be implemented by supplementing or adding functions of components included in a conventional BMS. For example, the relay 110, the comparator 120, the voltage source 130, the variable resistor 140 and the control unit 150 of the relay control apparatus 100 may be implemented as components of the BMS.

In addition, the relay control apparatus 100 according to the present disclosure may be provided to a battery pack 1. For example, referring to FIGS. 2 and 4, the battery pack 1 may include the relay control apparatus 100. In addition, the battery pack 1 may further include at least one battery cell 10, electrical equipment (a relay, a fuse, etc.), and a case. Accordingly, by controlling the operation state of the relay 110 according to the magnitude of the comparison voltage, the relay control apparatus 100 may prevent a high voltage from being applied to various components included in the battery pack 1 as a result.

The embodiments of the present disclosure described above may not be implemented only through an apparatus, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
10: battery cell
20: load
100: relay control apparatus
110: relay
120: comparator
130: voltage source
140: variable resistor
150: control unit

What is claimed is:

1. A relay control apparatus, comprising:
a relay disposed on a main path between a battery cell and a pack terminal and configured to electrically connect or disconnect the main path according to an operation state of the relay; and
a comparator configured to receive a comparison voltage from the main path and output a result signal to the relay based on a difference between a reference voltage and the comparison voltage,
wherein the relay is further configured to receive the result signal and control the operation state of the relay to a turn-on state or a turn-off state according to a magnitude of the received result signal, and
wherein the comparator is configured to receive the reference voltage corresponding to a withstanding voltage of the relay.

2. The relay control apparatus according to claim 1, wherein the comparator is configured to receive the comparison voltage between the relay and the pack terminal.

3. The relay control apparatus according to claim 1, wherein the relay includes a diode disposed so that a direction from the battery cell toward the pack terminal is a forward direction.

4. The relay control apparatus according to claim 1, wherein the comparator is configured to output a first result signal for controlling the operation state of the relay to a turn-off state, when the comparison voltage is greater than the reference voltage.

5. The relay control apparatus according to claim 1, wherein the comparator is configured to output a second result signal for controlling the operation state of the relay to a turn-on state, when the comparison voltage is smaller than the reference voltage.

6. The relay control apparatus according to claim 1, further comprising:
a voltage source configured to apply the reference voltage to the comparator;
a variable resistor configured to be disposed between the voltage source and the comparator; and
a controller configured to adjust a magnitude of the reference voltage applied to the comparator to correspond to the withstanding voltage of the relay by adjusting a resistance of the variable resistor.

7. A relay control apparatus, comprising:
a relay disposed on a main path between a battery cell and a pack terminal and configured to electrically connect or disconnect the main path according to an operation state of the relay; and
a comparator configured to receive a comparison voltage from the main path and output a result signal to the relay based on a difference between a reference voltage and the comparison voltage;
a voltage source configured to apply the reference voltage to the comparator;
a variable resistor configured to be disposed between the voltage source and the comparator; and
a controller configured to adjust a magnitude of the reference voltage applied to the comparator to correspond to the withstanding voltage of the relay by adjusting a resistance of the variable resistor,
wherein the relay is further configured to receive the result signal and control the operation state of the relay to a turn-on state or a turn-off state according to a magnitude of the received result signal, and wherein the controller is configured to determine a degree of degradation of the relay and adjust a magnitude of the variable resistor based on the determined degree of degradation.

8. The relay control apparatus according to claim 7, wherein the controller is configured to determine the degree of degradation according to a number of operations of the relay.

9. A battery pack, comprising the relay control apparatus according to claim 1.

* * * * *